US010261378B2

(12) United States Patent
Yokoyama et al.

(10) Patent No.: US 10,261,378 B2
(45) Date of Patent: Apr. 16, 2019

(54) DISPLAY DEVICE

(71) Applicant: Semiconductor Energy Laboratory Co., Ltd., Atsugi-shi, Kanagawa-ken (JP)

(72) Inventors: Masatoshi Yokoyama, Tochigi (JP); Shigeki Komori, Tochigi (JP); Manabu Sato, Tochigi (JP); Kenichi Okazaki, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/026,227

(22) Filed: Jul. 3, 2018

(65) Prior Publication Data

US 2018/0329244 A1 Nov. 15, 2018

Related U.S. Application Data

(63) Continuation of application No. 15/144,916, filed on May 3, 2016, now Pat. No. 10,018,887, which is a (Continued)

(30) Foreign Application Priority Data

Jul. 20, 2012 (JP) .................................. 2012-161726

(51) Int. Cl.
G02F 1/1343 (2006.01)
G02F 1/1368 (2006.01)
(Continued)

(52) U.S. Cl.
CPC ........ *G02F 1/1368* (2013.01); *G02F 1/13439* (2013.01); *G02F 1/133345* (2013.01);
(Continued)

(58) Field of Classification Search
CPC .............. G02F 2001/134372; G02F 1/136213
See application file for complete search history.

(56) References Cited

U.S. PATENT DOCUMENTS 4,636,038 A 1/1987 Kitahara et al.
5,731,856 A 3/1998 Kim et al.
(Continued)

FOREIGN PATENT DOCUMENTS

CN 001450665 A 10/2003
CN 102280445 A 12/2011
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

Primary Examiner — Phu Vu
(74) Attorney, Agent, or Firm — Robinson Intellectual Property Law Office; Eric J. Robinson

(57) ABSTRACT

To suppress a variation in characteristics of a transistor due to a released gas from an organic insulating film so that reliability of a display device is increased. The display device includes a transistor, an organic insulating film which is provided over the transistor in order to reduce unevenness due to the transistor, and a capacitor over the organic insulating film. An entire surface of the organic insulating film is not covered with components (a transparent conductive layer and an inorganic insulating film) of the capacitor, and a released gas from the organic insulating film can be released to the outside from exposed part of an upper surface of the organic insulating film.

20 Claims, 8 Drawing Sheets

Related U.S. Application Data continuation of application No. 14/746,885, filed on Jun. 23, 2015, now Pat. No. 9,366,894, which is a continuation of application No. 13/942,468, filed on Jul. 15, 2013, now Pat. No. 9,097,925.

(51) Int. Cl.

| | | |
|---|---|---|
| *H01L 29/423* | (2006.01) | |
| *H01L 27/12* | (2006.01) | |
| *H01L 29/24* | (2006.01) | |
| *G02F 1/1362* | (2006.01) | |
| *H01L 29/786* | (2006.01) | |
| *H01L 29/04* | (2006.01) | |
| *G02F 1/1333* | (2006.01) | |

(52) U.S. Cl.
CPC .. *G02F 1/134309* (2013.01); *G02F 1/136213* (2013.01); *G02F 1/136227* (2013.01); *G02F 1/136277* (2013.01); *H01L 27/1222* (2013.01); *H01L 27/1225* (2013.01); *H01L 27/1248* (2013.01); *H01L 27/1255* (2013.01); *H01L 29/04* (2013.01); *H01L 29/24* (2013.01); *H01L 29/42356* (2013.01); *H01L 29/42384* (2013.01); *H01L 29/7869* (2013.01); *G02F 2001/134372* (2013.01); *G02F 2202/02* (2013.01); *G02F 2202/10* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,313,481 | B1 | 11/2001 | Ohtani et al. |
| 6,563,174 | B2 | 5/2003 | Kawasaki et al. |
| 6,727,522 | B1 | 4/2004 | Kawasaki et al. |
| 6,960,786 | B2 | 11/2005 | Yamazaki et al. |
| 7,038,239 | B2 | 5/2006 | Murakami et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,202,498 | B2 | 4/2007 | Kim |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,525,626 | B2 | 4/2009 | Nagano |
| 7,554,116 | B2 | 6/2009 | Yamazaki et al. |
| 7,583,336 | B2 | 9/2009 | Ahn |
| 7,632,692 | B2 | 12/2009 | Kim |
| 7,671,369 | B2 | 3/2010 | Yamazaki et al. |
| 7,674,650 | B2 | 3/2010 | Akimoto et al. |
| 7,696,529 | B2 | 4/2010 | Choo et al. |
| 7,732,819 | B2 | 6/2010 | Akimoto et al. |
| 7,742,113 | B2 | 6/2010 | Tanabe et al. |
| 7,760,309 | B2 | 7/2010 | Ahn et al. |
| 7,859,510 | B2 | 12/2010 | Umezaki |
| 7,955,975 | B2 | 6/2011 | Murakami et al. |
| 7,968,357 | B2 | 6/2011 | Tanabe et al. |
| 7,989,808 | B2 | 8/2011 | Yamazaki et al. |
| 7,994,504 | B2 | 8/2011 | Murakami et al. |
| 7,999,263 | B2 | 8/2011 | Murakami et al. |
| 8,008,666 | B2 | 8/2011 | Yamazaki et al. |
| 8,115,893 | B2 | 2/2012 | Jung et al. |
| 8,120,033 | B2 | 2/2012 | Murakami et al. |
| 8,129,717 | B2 | 3/2012 | Yamazaki et al. |
| 8,207,537 | B2 | 6/2012 | Yamazaki et al. |
| 8,330,915 | B2 | 12/2012 | Abe et al. |
| 8,377,765 | B2 | 2/2013 | Tanabe et al. |
| 8,399,182 | B2 | 3/2013 | Lim et al. |
| 8,415,669 | B2 | 4/2013 | Yamazaki et al. |
| 8,471,259 | B2 | 6/2013 | Yamazaki et al. |
| 8,481,998 | B2 | 7/2013 | Cho et al. |
| 8,502,215 | B2 | 8/2013 | Murakami et al. |
| 8,513,701 | B2 | 8/2013 | Tanabe et al. |
| 8,553,182 | B2 | 10/2013 | Sugiyama et al. |
| 8,563,982 | B2 | 10/2013 | Nakamura et al. |
| 8,675,163 | B2 | 3/2014 | Abe et al. |
| 8,704,962 | B2 | 4/2014 | Oh et al. |
| 8,729,544 | B2 | 5/2014 | Yamazaki et al. |
| 8,735,901 | B2 | 5/2014 | Tanabe et al. |
| 8,810,757 | B2 | 8/2014 | Sugiyama et al. |
| 8,835,271 | B2 | 9/2014 | Yamazaki et al. |
| 8,946,717 | B2 | 2/2015 | Murakami et al. |
| 8,946,718 | B2 | 2/2015 | Murakami et al. |
| 9,025,103 | B2 | 5/2015 | Tanabe et al. |
| 9,082,857 | B2 | 7/2015 | Yamazaki et al. |
| 9,087,745 | B2 | 7/2015 | Yamazaki et al. |
| 9,097,925 | B2 | 8/2015 | Yokoyama et al. |
| 9,105,727 | B2 | 8/2015 | Murakami et al. |
| 9,111,804 | B2 | 8/2015 | Yamazaki et al. |
| 9,170,463 | B2 | 10/2015 | Nakamura et al. |
| 9,366,894 | B2 | 6/2016 | Yokoyama et al. |
| 9,406,806 | B2 | 8/2016 | Murakami et al. |
| 9,425,045 | B2 | 8/2016 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |

(56) References Cited

U.S. PATENT DOCUMENTS

| | | |
|---|---|---|
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0073615 A1 | 3/2010 | Yaguchi et al. |
| 2010/0073616 A1 | 3/2010 | Abe et al. |
| 2010/0092800 A1 | 4/2010 | Itagaki et al. |
| 2010/0109002 A1 | 5/2010 | Itagaki et al. |
| 2010/0117991 A1 | 5/2010 | Koyama et al. |
| 2010/0165255 A1 | 7/2010 | Ishitani et al. |
| 2011/0084272 A1 | 4/2011 | Miyanaga et al. |
| 2012/0153292 A1 | 6/2012 | Nakamura et al. |
| 2014/0022479 A1 | 1/2014 | Hosaka et al. |
| 2014/0377893 A1 | 12/2014 | Ishitani et al. |
| 2015/0001545 A1 | 1/2015 | Yamazaki et al. |
| 2015/0212364 A1 | 7/2015 | Tanabe et al. |
| 2015/0303280 A1 | 10/2015 | Yamazaki et al. |
| 2015/0349099 A1 | 12/2015 | Yamazaki et al. |
| 2016/0011478 A1 | 1/2016 | Nakamura et al. |
| 2016/0351693 A1 | 12/2016 | Yamazaki et al. |
| 2017/0323957 A1 | 11/2017 | Yamazaki et al. |

FOREIGN PATENT DOCUMENTS

| | | |
|---|---|---|
| CN | 102540603 A | 7/2012 |
| EP | 1737044 A | 12/2006 |
| EP | 2159845 A | 3/2010 |
| EP | 2226847 A | 9/2010 |
| EP | 2466365 A | 6/2012 |
| JP | 60-017720 A | 1/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-006796 A | 1/2004 |
| JP | 2004-103957 A | 4/2004 |
| JP | 2004-273614 A | 9/2004 |
| JP | 2004-273732 A | 9/2004 |
| JP | 2004-310099 A | 11/2004 |
| JP | 2005-173106 A | 6/2005 |
| JP | 2007-096227 A | 4/2007 |
| JP | 2007-123861 A | 5/2007 |
| JP | 2007-328210 A | 12/2007 |
| JP | 2009-271103 A | 11/2009 |
| JP | 2010-072527 A | 4/2010 |
| JP | 2010-072529 A | 4/2010 |
| JP | 2010-080952 A | 4/2010 |
| JP | 2010-170119 A | 8/2010 |
| JP | 2012-128159 A | 7/2012 |
| JP | 6126484 | 5/2017 |
| KR | 2012-0067288 A | 6/2012 |
| TW | 200712638 | 4/2007 |
| TW | 200811556 | 3/2008 |
| TW | 201218385 | 5/2012 |
| TW | 201218386 | 5/2012 |
| TW | 201229627 | 7/2012 |
| WO | WO-2004/114391 | 12/2004 |
| WO | WO-2011/145538 | 11/2011 |
| WO | WO-2014/013958 | 1/2014 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

International Search Report (Application No. PCT/JP2013/069230) dated Oct. 8, 2013.

Written Opinion (Application No. PCT/JP2013/069230) dated Oct. 8, 2013.

Chinese Office Action (Application No. 201380038555.9) dated Nov. 21, 2016.

Taiwanese Office Action (Application No. 105137465) dated Dec. 20, 2016.

German Office Action (Application No. 112013007498.2) dated Mar. 22, 2017.

Taiwanese Office Action (Application No. 107124269) dated Dec. 18, 2018.

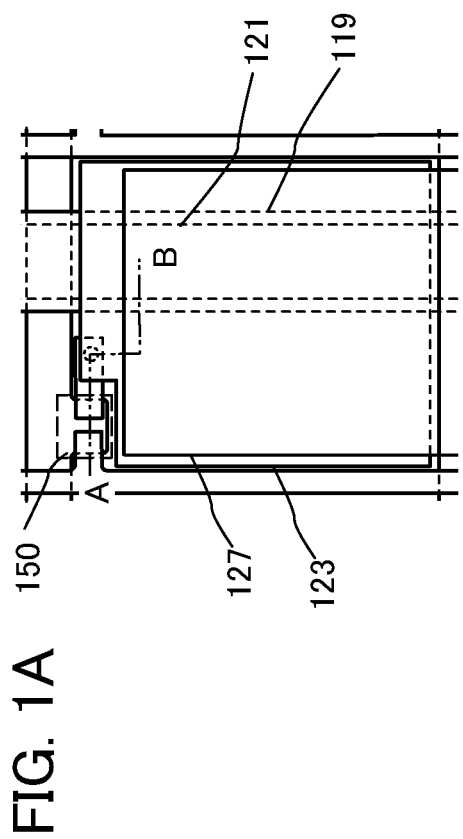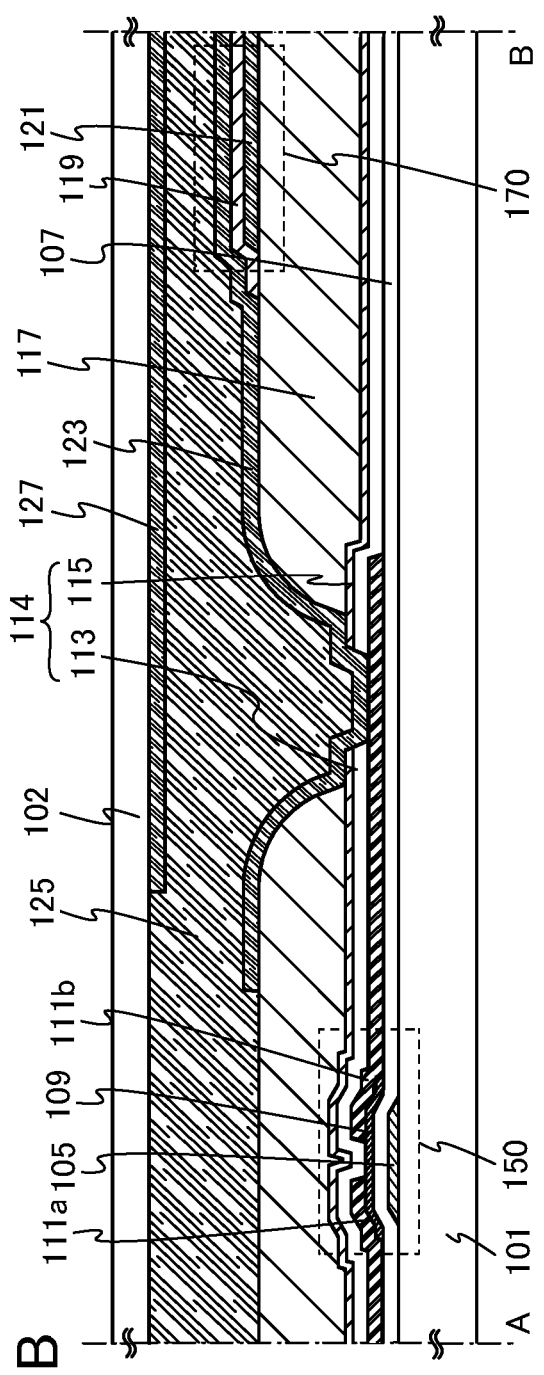
FIG. 1A
FIG. 1B

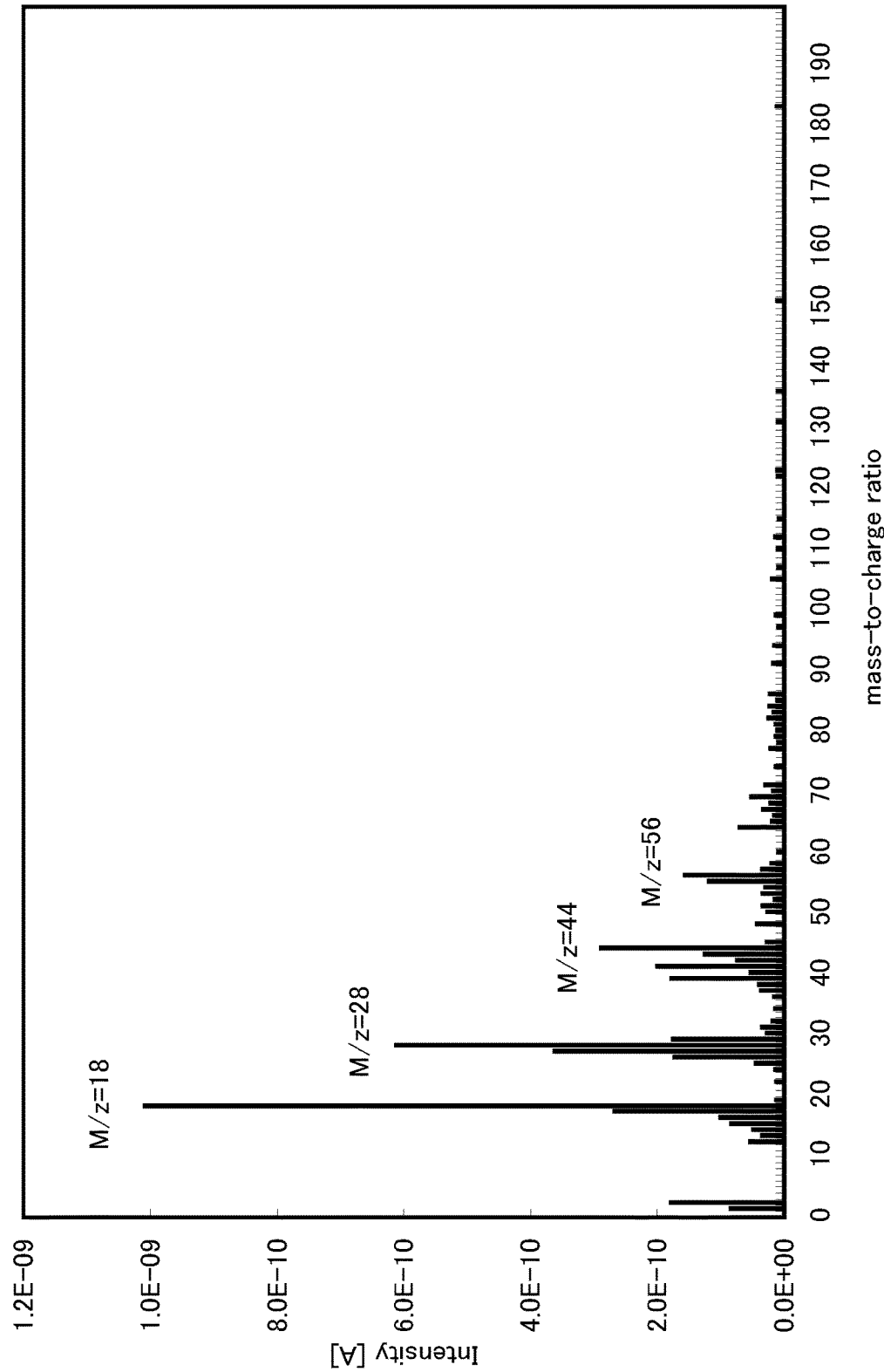

DISPLAY DEVICE

TECHNICAL FIELD

One embodiment of the present invention relates to a display device and a method for manufacturing the display device.

BACKGROUND ART

Transistors used for many liquid crystal display devices or many display devices such as flat panel displays typified by a light-emitting display device utilizing electroluminescence (EL) each include a semiconductor such as amorphous silicon, single crystal silicon, or polycrystalline silicon formed over a glass substrate.

Attention has been directed to a technique in which, instead of the above silicon semiconductor, an oxide exhibiting semiconductor characteristics (hereinafter referred to as an oxide semiconductor) is used for a transistor.

For example, a technique is disclosed in which a transistor is manufactured using an In—Ga—Zn oxide layer as an oxide semiconductor and the transistor is used as a switching element or the like of a pixel of a display device (see Patent Document 1).

REFERENCE

Patent Documents

[Patent Document 1] Japanese Published Patent Application No. 2007-123861

DISCLOSURE OF INVENTION

In a transistor including an oxide semiconductor in a channel formation region, when an impurity such as hydrogen or moisture enters the oxide semiconductor, carriers are generated, and thus electric characteristics of the transistor vary.

Accordingly, in the transistor included in a display device, when an impurity such as hydrogen or moisture unintentionally enters a semiconductor layer of the transistor from an organic insulating film which is provided over the transistor, the carrier density of the semiconductor layer is increased, and thus characteristics of the transistor vary.

Further, there is a problem in that when the characteristics of the transistor vary, the display quality of the display device deteriorates and the reliability is lowered.

In view of the foregoing, an object of one embodiment of the present invention is to suppress a variation in the electric characteristics of a transistor included in a display device so that reliability is increased. Another object is to suppress deterioration of display quality of a display device including a transistor so that reliability is increased.

A display device of one embodiment of the present invention includes a transistor, an organic insulating film over the transistor, which is provided in order to reduce unevenness due to the transistor, and a capacitor over the organic insulating film. With a structure in which an entire surface of the organic insulating film is not covered with components of the capacitor (transparent conductive layers and an inorganic insulating film), a gas released from the organic insulating film (also referred to as released gas) can be released to the outside of the organic insulating film from part of an upper surface of the organic insulating film.

One embodiment of the present invention is a display device including a pixel portion which includes a transistor; a first inorganic insulating film which covers the transistor; an organic insulating film over the first inorganic insulating film; a first transparent conductive layer over the organic insulating film; a second inorganic insulating film over the first transparent conductive layer; a second transparent conductive layer which is provided at least over the first transparent conductive layer with the second inorganic insulating film interposed therebetween and electrically connected to a source electrode layer or a drain electrode layer of the transistor in an opening formed in the organic insulating film and the first inorganic insulating film; and a liquid crystal layer over the second transparent conductive layer. In the pixel portion, an edge portion of the second inorganic insulating film is in a region which overlaps with the organic insulating film.

When the edge portion of the second inorganic insulating film is in the region which overlaps with the organic insulating film, the organic insulating film has a region which does not overlap with the second inorganic insulating film. Accordingly, a released gas from the organic insulating film can be released upward from an exposed region of the organic insulating film, which does not overlap with the second inorganic insulating film.

Further, in the above-described structure, the region of the organic insulating film, which does not overlap with the second inorganic insulating film, may overlap with the transistor.

Another embodiment of the present invention is a display device including a transistor; a first inorganic insulating film which covers the transistor; an organic insulating film over the first inorganic insulating film; a first transparent conductive layer over the organic insulating film; a second inorganic insulating film over the first transparent conductive layer; a second transparent conductive layer which is provided at least over the first transparent conductive layer with the second inorganic insulating film interposed therebetween and electrically connected to a source electrode layer or a drain electrode layer of the transistor in an opening formed in the organic insulating film and the first inorganic insulating film; and a liquid crystal layer over the second transparent conductive layer. The liquid crystal layer and the organic insulating film are at least partly in contact with each other.

Further, the liquid crystal layer and the organic insulating film may be in contact with each other in a region which overlaps with the transistor, in the above-described structure.

The transistor may be a transistor in which a channel is formed in an oxide semiconductor layer.

Each of the first inorganic insulating film and the second inorganic insulating film is preferably a silicon nitride film or a silicon nitride oxide film.

The organic insulating film is preferably a film containing acrylic. A flat surface can be obtained easily by using an organic resin such as acrylic.

It is preferable that a difference in refractive index between the second inorganic insulating film and the first transparent conductive layer or the second transparent conductive layer be less than or equal to 10%, more preferably less than or equal to 5% of the refractive index of the first transparent conductive layer or the second transparent conductive layer. Further, a film having a refractive index between the refractive indexes of the organic insulating film and the transparent conductive layer is preferably formed between the organic insulating film and the first transparent conductive layer.

In the display device, the alignment of the liquid crystal layer is controlled in accordance with the electric field generated between the first transparent conductive layer and the second transparent conductive layer.

Further, it is preferable that the first inorganic insulating film and the second inorganic insulating film be at least partly in contact with each other.

According to one embodiment of the present invention, a variation in the electric characteristics of a transistor included in a display device can be suppressed, so that higher reliability can be obtained. Further, deterioration of the display quality of the display device including the transistor can be suppressed, so that higher reliability can be obtained.

BRIEF DESCRIPTION OF DRAWINGS

In the accompanying drawings:

FIGS. 1A and 1B are a top view and a cross-sectional view, respectively, illustrating a display device of one embodiment of the present invention;

FIG. 3 shows the ion intensity of released gas in each mass-to-charge ratio;

BEST MODE FOR CARRYING OUT THE INVENTION

Figure 2A:
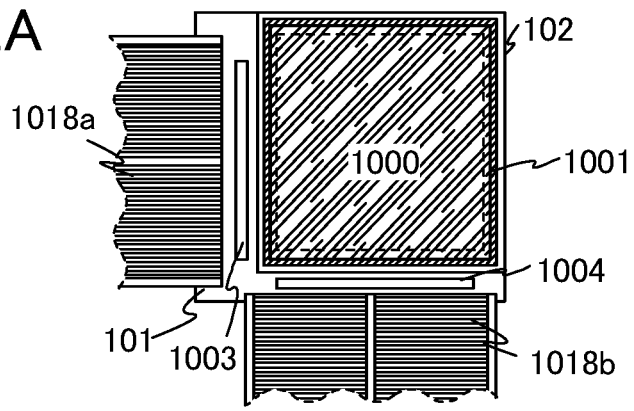
FIGS. 2A to 2C are top views each illustrating a display device of one embodiment of the present invention.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments.

Further, in embodiments hereinafter described, the same parts are denoted with the same reference numerals throughout the drawings. The thickness, width, relative relation of position, and the like of elements illustrated in the drawings are exaggerated for clarification of description of the embodiments in some cases.

Note that the term such as "over" in this specification and the like does not necessarily mean that a component is placed "directly on" another component. For example, the expression "a gate electrode layer over an insulating film" can mean the case where there is an additional component between the insulating film and the gate electrode layer. The same applies to the term "below".

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" and "wiring layers", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are an electrode and a wiring.

(Embodiment 1)

Figure 2B:
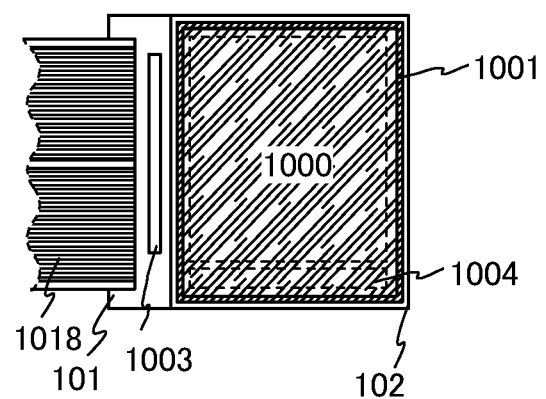
Figure 2C:
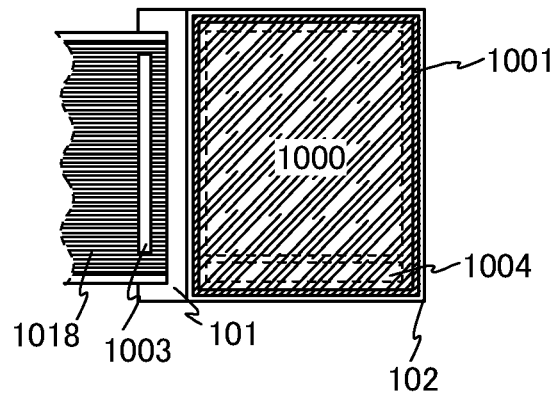

In this embodiment, a display device of one embodiment of the present invention will be described with reference to the drawings. FIGS. 2A to 2C are top views each illustrating a display device of this embodiment.

FIG. 2A is a top view illustrating a display device of one embodiment of the present invention. In FIG. 2A, a sealant 1001 is provided so as to surround a pixel portion 1000 provided over a first substrate 101, and sealing is performed using a second substrate 102. In FIG. 2A, a scan line driver circuit 1004 and a signal line driver circuit 1003 each of which is formed using a single crystal semiconductor film or a polycrystalline semiconductor film over a substrate separately prepared are mounted in a region different from the region surrounded by the sealant 1001 over the first substrate 101. Various signals and potentials are supplied from flexible printed circuits (FPCs) 1018a and 1018b to the signal line driver circuit 1003, the scan line driver circuit 1004, and the pixel portion 1000 each of which is separately formed.

Note that a connection method of a separately formed driver circuit is not particularly limited, and a chip on glass (COG) method, a wire bonding method, a tape automated bonding (TAB) method or the like can be used. FIG. 2A illustrates an example in which the signal line driver circuit 1003 and the scan line driver circuit 1004 are mounted by a COG method.

Further, the display device includes a panel where a display element is sealed and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Note that the structure of the display device described in this embodiment is not limited the above structure. As illustrated in FIG. 2B, the sealant 1001 may be provided so as to surround the pixel portion 1000 and the scan line driver circuit 1004 which are provided over the first substrate 101. The second substrate 102 may be provided over the pixel portion 1000 and the scan line driver circuit 1004. Thus, the pixel portion 1000 and the scan line driver circuit 1004 are sealed together with a display element, by the first substrate 101, the sealant 1001, and the second substrate 102.

As the sealant 1001, it is typically preferable to use visible light curable, ultraviolet curable, or heat curable resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant 1001.

In FIGS. 2B and 2C, a signal line driver circuit 1003 that is formed using a single crystal semiconductor film or a polycrystalline semiconductor film over a substrate separately prepared is mounted in a region different from the region surrounded by the sealant 1001 over the first substrate 101. Further, a variety of signals and a potential are supplied to the signal line driver circuit 1003 which is formed separately, the scan line driver circuit 1004, and the pixel portion 1000 from an FPC 1018.

Further, FIG. 2B illustrates an example in which the signal line driver circuit 1003 is formed separately and mounted on the first substrate 101, and FIG. 2C illustrates an example in which the signal line driver circuit 1003 is mounted on the FPC 1018. Note that the structure of the display device of this embodiment is not limited to the structure. The scan line driver circuit may be formed separately and then mounted, or only part of the signal line driver circuit or part of the scan line driver circuit may be formed separately and then mounted.

FIGS. 1A and 1B illustrate one pixel included in the pixel portion 1000 of the display device of one embodiment of the present invention. FIG. 1A is a top view illustrating part of the pixel included in the pixel portion 1000, and FIG. 1B is a cross-sectional view taken along dashed-dotted line A-B in FIG. 1A.

The pixel portion included in the display device of one embodiment of the present invention includes a transistor 150 provided over the first substrate 101; a first inorganic insulating film 114 (a stacked layer of an inorganic insulating film 113 and an inorganic insulating film 115) over the transistor 150; an organic insulating film 117 over the first inorganic insulating film 114; a capacitor 170 over the organic insulating film 117; a liquid crystal layer 125 over the organic insulating film 117 and the capacitor 170; the second substrate 102 over the liquid crystal layer 125; and a transparent conductive layer 127 provided on the second substrate 102. The capacitor 170 includes a transparent conductive layer 121, a transparent conductive layer 123, and a second inorganic insulating film 119 interposed between the transparent conductive layer 121 and the transparent conductive layer 123.

Note that as apparent from FIG. 1B, an edge portion of the second inorganic insulating film 119 is in a region which overlaps with the organic insulating film 117. Therefore, there is a region in which the second inorganic insulating film 119 and the organic insulating film 117 do not overlap with each other, and thus a released gas from the organic insulating film 117 can be released upward from an exposed region of the organic insulating film 117. Further, the second inorganic insulating film 119 is not provided in a region which overlaps with the transistor 150, and the region where the organic insulating film 117 and the second inorganic insulating film 119 do not overlap with each other and the organic insulating film 117 is exposed overlaps with the transistor 150. Furthermore, the organic insulating film 117 has an exposed region which does not overlap with the second inorganic insulating film 119, the transparent conductive layer 121, and the transparent conductive layer 123.

The display device of one embodiment of the present invention has a region in which the second inorganic insulating film 119 is not provided over the organic insulating film 117, part of an upper surface of the organic insulating film 117 is exposed, and a released gas in the organic insulating film 117 is released from the part of the upper surface of the organic insulating film 117 to the outside. Accordingly, the released gas is prevented from entering the transistor side and characteristics of the transistor 150 is unlikely to vary, so that a highly reliable display device whose display quality is prevented from deteriorating can be obtained.

The transistor 150 includes a gate electrode layer 105 over the first substrate 101; a gate insulating layer 107 covering the gate electrode layer 105; a semiconductor layer 109 over the gate insulating layer 107; a source electrode layer 111a and a drain electrode layer 111b which are in contact with the semiconductor layer 109.

For the semiconductor layer in the transistor 150, a silicon-based semiconductor (amorphous silicon, polycrystalline silicon, or the like), an oxide semiconductor (zinc oxide, indium oxide, or the like), or the like can be used. In this embodiment, the case where an oxide semiconductor is used as a preferable semiconductor used for the semiconductor layer 109 is described.

The inorganic insulating film 113 and the inorganic insulating film 115 are formed over the transistor 150 as the first inorganic insulating film 114. Note that the structure of the first inorganic insulating film 114 is not limited thereto and may be a single-layer structure of an insulating film or a stacked-layer structure thereof depending on required functions.

As the inorganic insulating film 113 provided over the transistor 150, an oxide insulating layer of silicon oxide, gallium oxide, aluminum oxide, silicon oxynitride, silicon nitride oxide, hafnium oxide, tantalum oxide, or the like can be used. Further, the inorganic insulating film 113 can be formed with a single-layer structure or a stacked-layer structure including two or more layers with the use of these compounds.

Here, a silicon oxynitride means the one that contains more oxygen than nitrogen and for example, silicon oxynitride includes oxygen, nitrogen, and silicon at concentrations ranging from greater than or equal to 50 atomic % and less than or equal to 70 atomic %, greater than or equal to 0.5 atomic % and less than or equal to 15 atomic %, and greater than or equal to 25 atomic % and less than or equal to 35 atomic %, respectively. Note that rates of oxygen, nitrogen, and silicon fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

The inorganic insulating film 115 over the inorganic insulating film 113 is a layer having functions of preventing an impurity such as hydrogen from entering the semiconductor layer 109 (hereinafter, the function is also referred to as a hydrogen blocking property) and preventing oxygen or the like in an oxide semiconductor layer from being released. With the inorganic insulating film 115 having a blocking effect against oxygen, hydrogen, water, and the like, diffusion of oxygen from the semiconductor layer 109 to the outside and entry of an impurity such as hydrogen from the organic insulating film 117 and the outside to the semiconductor layer 109 can be prevented.

As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The organic insulating film 117 serving as a planarization insulating layer for reducing unevenness due to the transistor 150 is provided over the inorganic insulating film 115. The planarization insulating layer is provided in order to prevent defective orientation or the like of the liquid crystal layer which is provided over the planarization insulating layer and improve display quality. When the organic insulating film is used as the planarization insulating layer, a flat surface can be obtained easily.

For the organic insulating film 117, for example, an organic material having heat resistance such as an acrylic resin, polyimide, a benzocyclobutene-based resin, polyamide, or an epoxy resin can be used. Note that the organic insulating film 117 may be formed by stacking a plurality of insulating films formed from any of these materials.

The capacitor 170 is formed over the organic insulating film 117. The capacitor 170 includes the transparent conductive layer 121 over the organic insulating film 117, the second inorganic insulating film 119 over the transparent conductive layer 121, and the transparent conductive layer 123 over the second inorganic insulating film 119. The transparent conductive layer 123 of the capacitor 170 is in contact with the drain electrode layer 111b of the transistor 150 in an opening provided in the first inorganic insulating film 114 and the organic insulating film 117.

The capacitor 170 over the organic insulating film 117 is formed with the transparent conductive layer 121, the second inorganic insulating film 119, and the transparent conductive layer 123. That is, the transparent conductive layer 121 serves as one electrode of the capacitor 170, the transparent conductive layer 123 serves as the other electrode of the capacitor 170, and the second inorganic insulating film 119 serves as a dielectric of the capacitor 170.

The storage capacitance of the capacitor 170 is set in consideration of leakage current or the like of the transistor 150 so that charge can be held for a predetermined period. The storage capacitance may be set considering the off-state current of the transistor or the like. By using a transistor including an oxide semiconductor film, a storage capacitor having a capacitance that is ⅓ or less, preferably ⅕ or less of liquid crystal capacitance of each pixel is enough.

In the transistor including an oxide semiconductor layer, the current in an off state (off-state current) can be made small. Accordingly, an electric signal such as an image signal can be held for a longer period, and a writing interval can be set longer in an on state. Accordingly, the frequency of refresh operation can be reduced, which leads to an effect of suppressing power consumption. Further, the transistor using an oxide semiconductor layer can be controlled to exhibit a high field-effect mobility and thus can operate at high speed.

Each of the transparent conductive layer 121 and the transparent conductive layer 123 is formed using a material having a visible-light-transmitting property. As a light-transmitting material, indium oxide, indium tin oxide, indium zinc oxide, zinc oxide, zinc oxide to which gallium is added, graphene, or the like can be used. Note that here, "transparent" means having a light-transmitting property with respect to visible light and an object which transmits visible light is referred to as a transparent object. Further, an object which transmits part of light even when the light is scattered is referred to as a transparent object. Furthermore, an object can be referred to as a transparent conductive layer as long as it transmits at least light in part of the visible light wavelength range even when it reflects light in another part of the visible light wavelength range. When the capacitor 170 is formed using a transparent material, the aperture ratio can be increased.

Here, a result obtained by examining a released gas from an acrylic resin which is a typical example of an organic resin used for the organic insulating film 117 is shown.

For a sample, an acrylic resin was applied onto a glass substrate, and heat treatment was performed in a nitrogen gas atmosphere at 250° C. for one hour. Note that the acrylic resin was formed so as to have a thickness of 1.5 μm after the heat treatment.

Measurement of the released gas from the manufactured sample was performed by thermal desorption spectroscopy (TDS).

FIG. 3 shows the ion intensity of the released gas in each mass-to-charge ratio (also referred to as M/z) when the substrate surface temperature is 250° C. As shown in FIG. 3, a gas of an ion having a mass-to-charge ratio of 18 (an $H_2O$ gas) which seems to be due to water, a gas of an ion having a mass-to-charge ratio of 28 (a $C_2H_4$ gas), a gas of an ion having a mass-to-charge ratio of 44 (a $C_3H_8$ gas), and a gas of an ion having a mass-to-charge ratio of 56 (a $C_4H_8$ gas), which seem to be due to hydrocarbon, were detected. Note that fragment ions of gases were detected in the vicinities of the respective mass-to-charge ratios.

Figure 4:
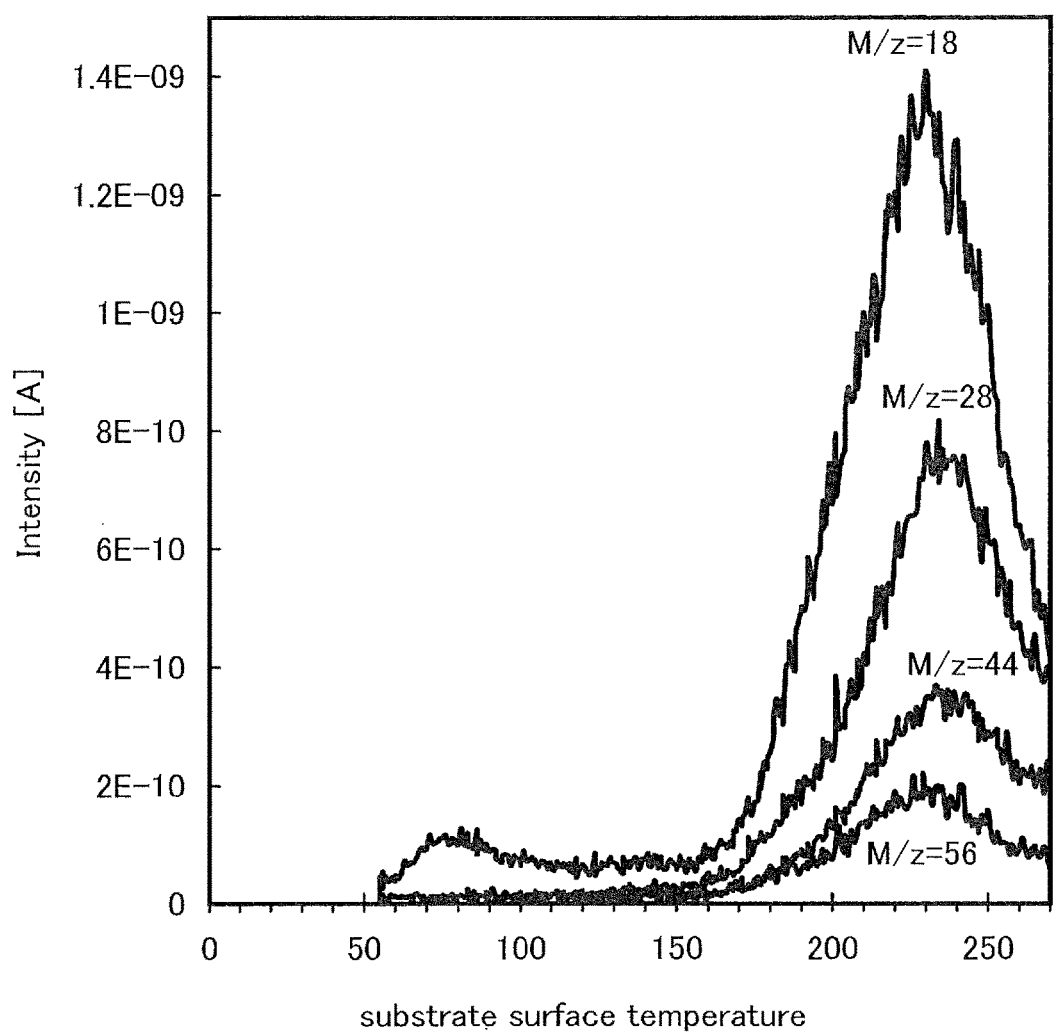
FIG. 4 shows the ion intensities of gases in the respective mass-to-charge ratios with respect to a substrate surface temperature.

FIG. 4 shows the ion intensities of the gases in the respective mass-to-charge ratios (18, 28, 44, and 56) with respect to a substrate surface temperature. It is found that in the case where the substrate surface temperature is in the range from 55° C. to 270° C., the intensity of an ion having a mass-to-charge ratio of 18 which seems to be due to water has a peak in the range of higher than or equal to 55° C. and lower than or equal to 100° C. and a peak in the range of higher than or equal to 150° C. and lower than or equal to 270° C. On the other hand, it is found that the intensities of ions having mass-to-charge ratio of 28, 44, and 56 which seem to be due to hydrocarbon each have a peak in the range of higher than or equal to 150° C. and lower than or equal to 270° C.

As described above, it was found that water, hydrocarbon, and the like, which serve as impurities in the oxide semiconductor film, are released from an organic resin. In particular, it was found that water was also released at a relatively low temperature of higher than or equal to 55° C. and lower than or equal to 100° C. In other words, this indicates that an impurity due to an organic resin reaches the oxide semiconductor film even at a relatively low temperature and electric characteristics of the transistor deteriorate.

It also indicates that in the case where the organic resin is covered with a film which does not transmit a released gas of water, hydrocarbon, or the like (e.g. a silicon nitride film, a silicon nitride oxide film, or an aluminum oxide film), release of a gas from the organic resin increases pressure which is applied to the film which does not transmit a released gas of water, hydrocarbon, or the like, which finally destroys the film which does not transmit a released gas of water, hydrocarbon, or the like and causes a shape defect of the transistor in some cases.

The second inorganic insulating film 119 which is interposed between the transparent conductive layer 121 and the transparent conductive layer 123 can be formed using a material which is similar to that of the first inorganic insulating film 114. The second inorganic insulating film 119 serves as a dielectric of the capacitor 170 and thus may be formed using a material having a dielectric constant required for the capacitor 170. For example, capacitance per unit area of the electrode can be increased with use of a silicon nitride film which has higher relative permittivity than a silicon oxide film or the like.

It is preferable to use an insulating layer in which a difference in refractive index between the transparent conductive layer 121 or the transparent conductive layer 123 and the second inorganic insulating film 119 is preferably less than or equal to 10%, more preferably less than or equal to 5% of the refractive index of the transparent conductive layer 121 or the transparent conductive layer 123. When the difference in refractive index between the transparent conductive layer 121 or the transparent conductive layer 123 and the second inorganic insulating film 119 is small, total reflection of light which occurs at an interface between the second inorganic insulating film 119 and the transparent conductive layer 121 or between the second inorganic insulating film 119 and the transparent conductive layer 123 is suppressed, so that light loss can be reduced.

Further, in a similar manner, an insulating film having a refractive index between the refractive indexes of the organic insulating film 117 and the transparent conductive layer 121 may be formed between the organic insulating film 117 and the transparent conductive layer 121 in order to prevent total reflection at an interface between the organic insulating film 117 and the transparent conductive layer 121. Alternatively, the following structure may be employed: a plurality of insulating films described above are formed, and the refractive indexes change stepwise from the organic insulating film 117 to the transparent conductive layer 121.

For example, the refractive index of an acrylic resin which is generally used as the organic insulating film is approximately 1.49, and the refractive index of indium tin oxide which is generally used as the transparent conductive layer 121 is 2.0. Accordingly, as an insulating film provided between the organic insulating film 117 and the transparent conductive layer 121, an insulating film having a refractive index greater than or equal to 1.5 and less than or equal to 1.9, preferably greater than or equal to 1.6 and less than or equal to 1.7 is preferably used. A stacked structure of the above insulating films may also be employed.

The refractive index of indium zinc oxide used for the transparent conductive layer 121 and the transparent conductive layer 123 is 2.0. A film of silicon nitride having a refractive index of approximately 2.03, which is a material having substantially the same refractive index as indium zinc oxide, can be preferably used as the second inorganic insulating film 119.

Note that there is no limitation on the shape of the second inorganic insulating film 119 as long as the second inorganic insulating film 119 forms a capacitor together with the transparent conductive layer 121 and the transparent conductive layer 123 and serves as a dielectric of the capacitor 170. In the case where a film which does not transmit a released gas from the organic insulating film 117 (e.g. a silicon nitride film or a silicon nitride oxide film) is used as the second inorganic insulating film 119, formation of the second inorganic insulating film 119 so as to cover an entire surface of the organic insulating film 117 causes diffusion of a gas released from the organic insulating film 117 into the transistor 150 side to change in characteristics of the transistor 150 in some cases.

Alternatively, in some cases, a released gas from the organic insulating film 117 is not released, and thus pressure which is applied from the organic insulating film 117 to the first inorganic insulating film 114 and the second inorganic insulating film 119 becomes higher, which causes destruction of the second inorganic insulating film 119 and a shape defect. By the shape defect, the second inorganic insulating film 119 has a region with a low film density and partly disappears, for example, in some cases. When such a region is formed, an impurity such as hydrogen enters the semiconductor layer 109 easily, and thus the characteristics of the transistor 150 vary in some cases.

Therefore, the second inorganic insulating film 119 is preferably formed so that a gas from the organic insulating film 117 is released upwards (in the direction opposite to that of the transistor 150). Specifically, the edge portion of the second inorganic insulating film 119 is preferably in a region which overlaps with the organic insulating film 117. When the edge portion of the second inorganic insulating film 119 is in the region which overlaps with the organic insulating film 117, the entire surface of the organic insulating film 117 is not covered with the inorganic insulating film 113 and the second inorganic insulating film 119, and thus the organic insulating film 117 has an exposed portion from which a released gas from the organic insulating film 117 is released.

Here, the exposed portion of the organic insulating film 117 means a region of the organic insulating film 117 which does not overlap with at least the second inorganic insulating film 119. When the organic insulating film 117 has an exposed portion, a released gas from the organic insulating film 117 can be released upwards, so that an impurity can be prevented from entering the transistor 150.

Note that although the exposed region of the organic insulating film 117 may be provided in any place in the pixel portion 1000, because a gas released from the organic insulating film 117 contains an impurity such as hydrogen, the exposed region of the organic insulating film 117 is preferably provided so that a gas released from the organic insulating film 117 does not enter the transistor 150 side.

For example, the organic insulating film 117 may at least partly have the exposed region in a region of the organic insulating film 117 which overlaps with the transistor 150. For example, the organic insulating film 117 may be exposed in a region which overlaps with part of the source electrode layer 111a or the drain electrode layer 111b of the transistor 150. Alternatively, at least part of the organic insulating film 117 may be exposed in a region where the organic insulating film 117 and the semiconductor layer 109 overlap with each other.

Further, the exposed region of the organic insulating film 117 may be formed on a surface of the organic insulating film 117, which does not face the semiconductor layer 109, so that a gas from the organic insulating film 117 is released from the surface opposite to a surface of the organic insulating film 117, which faces the semiconductor layer 109 included in the transistor 150. Alternatively, it is preferable that the surface of the organic insulating film 117 which does not face the semiconductor layer 109 (e.g. a region in contact with the liquid crystal layer 125 in FIG. 1B) have more exposed regions than the surface of the organic insulating film 117 which faces the semiconductor layer 109.

Further alternatively, the following structure may be employed: the organic insulating film 117 and the sealant 1001 (not illustrated) are not in contact with each other, and a side surface of the organic insulating film 117 has an exposed region without formation of an insulating layer, a transparent conductive layer, or the like so that a released gas can be released from the side surface of the organic insulating film 117 (a surface facing the sealant 1001). Note that an edge portion of the organic insulating film 117 may be covered with the second inorganic insulating film 119.

In the display device described in this embodiment, the exposed portion of the organic insulating film is provided over the transistor so that a gas released from the organic insulating film which is provided over the transistor does not enter the transistor side. The exposed portion is the region which does not overlap with the inorganic insulating film which is formed over the organic insulating film. Since the inorganic insulating film is formed so as not to be in contact with the exposed portion, a gas from the organic insulating film can be released from the exposed portion. Accordingly, a gas containing an impurity such as hydrogen which is released from the organic insulating film can be prevented from entering the oxide semiconductor layer, and characteristics of the transistor can be prevented from varying, so that a display device having high display quality and high reliability can be obtained.

The transistor 150 includes the gate electrode layer 105 over the first substrate 101.

It is necessary that the first substrate 101 at least have heat resistance sufficient to withstand heat treatment to be performed later. For example, a glass substrate of barium borosilicate glass, aluminoborosilicate glass, or the like, a ceramic substrate, a quartz substrate, or a sapphire substrate can be used.

Note that the first substrate 101 is preferably made to shrink (also referred to as thermally shrink) by heat treatment performed in advance at a temperature lower than a strain point of the first substrate 101, whereby the amount of shrinkage caused in the first substrate 101 by the heat treatment performed in the manufacturing process of the display device can be suppressed. Accordingly, for example, misalignment of a pattern in a light exposure step or the like can be suppressed. In addition, moisture, organic substances, and the like, which are attached to the surface of the first substrate 101, can be removed by the heat treatment.

Further, a substrate in which an insulating layer is formed over a single crystal semiconductor substrate or a polycrystalline semiconductor substrate made of silicon, silicon carbide, or the like, or a compound semiconductor substrate made of silicon germanium or the like, can also be used.

The gate electrode layer 105 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. Furthermore, the gate electrode layer 105 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

In order to reduce the resistance of the gate electrode layer 105 and ensure sufficient heat resistance thereof, the following structure may be employed: a film of a high-melting-point metal such as titanium, molybdenum, or tungsten, or a nitride film of any of these metals (a titanium nitride film, a molybdenum nitride film, or a tungsten nitride film) is stacked either or both of over and under a metal film of aluminum, copper, or the like, which has low resistivity.

The gate electrode layer 105 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of a metal nitride (such as InN or ZnN), or the like may be provided between the gate electrode layer 105 and the gate insulating layer 107. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and a so-called normally-off switching element can be achieved. For example, in the case of using an In—Ga—Zn-based oxynitride semiconductor film, an In—Ga—Zn-based oxynitride semiconductor film having a nitrogen concentration higher than at least that of the oxide semiconductor film, specifically, an In—Ga—Zn-based oxynitride semiconductor film having a nitrogen concentration of 7 at. % or higher is used.

The gate insulating layer 107 may be formed with a single layer or a stack using, for example, one or more of silicon oxide, silicon oxynitride, silicon nitride oxide, silicon nitride, aluminum oxide, hafnium oxide, gallium oxide, a Ga—Zn-based metal oxide, and the like.

Further, the gate insulating layer 107 is in contact with an oxide semiconductor; therefore, the gate insulating layer 107 is preferably a film in which the hydrogen concentration is reduced and which suppresses entry of hydrogen into the oxide semiconductor and can supply oxygen to oxygen vacancies in the oxide semiconductor. For example, a film which supplies oxygen preferably includes, in the film (bulk), an amount of oxygen which exceeds at least the amount of oxygen in the stoichiometric composition. For example, in the case where a silicon oxide film is used as the gate insulating layer 107, the composition formula of the gate insulating layer 107 is $SiO_{2+\alpha}$ ($\alpha > 0$).

From an insulating film including oxygen whose amount exceeds the amount of oxygen in the stoichiometric composition, part of the oxygen is released by heating. Thus, when the insulating film from which part of oxygen is released by heating is provided as the gate insulating layer 107, oxygen is supplied to the oxide semiconductor, so that oxygen vacancies in the oxide semiconductor can be filled.

With use of a film from which oxygen is released by heating as the gate insulating layer 107, interface state density at the interface between the oxide semiconductor film and the gate insulating layer 107 can be reduced. Thus, a transistor with less deterioration in electric characteristics can be obtained. Further, when an insulating film having a blocking effect against oxygen, hydrogen, water, and the like is provided as the gate insulating layer 107, oxygen can be prevented from diffusing from the oxide semiconductor film to the outside, and hydrogen, water, and the like can be prevented from entering the oxide semiconductor film from the outside. As the insulating film having a blocking effect against oxygen, hydrogen, water, and the like, an aluminum oxide film, an aluminum oxynitride film, a gallium oxide film, a gallium oxynitride film, a yttrium oxide film, a yttrium oxynitride film, a hafnium oxide film, a hafnium oxynitride film, or the like can be given.

The gate insulating layer 107 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating layer 107 is preferably greater than or equal to 5 nm and less than or equal to 400 nm, more preferably greater than or equal to 10 nm and less than or equal to 300 nm, still more preferably greater than or equal to 50 nm and less than or equal to 250 nm.

The gate insulating layer 107 has a stacked-layer structure in which the following layers each formed using a PECVD apparatus are stacked from the gate electrode layer side: a 50-nm-thick silicon nitride layer as a first gate insulating layer having an effect of preventing a metal component contained in the gate electrode layer 105 from diffusing; a 300-nm-thick silicon nitride layer as a second gate insulating layer having an excellent dielectric strength voltage; a 50-nm-thick silicon nitride layer as a third gate insulating layer having a high blocking property against hydrogen; and a 50-nm-thick silicon oxynitride layer as a fourth gate insulating layer having an effect of reducing the interface state density.

Further, in the case where an oxide semiconductor is used for the semiconductor layer 109, an oxide insulator from which oxygen is released by heating may be used for the inorganic insulating film 113, like the gate insulating layer 107. Furthermore, after formation of the inorganic insulating film 113 over the oxide semiconductor, oxygen is introduced to the oxide semiconductor layer by heating, whereby oxygen vacancies in the oxide semiconductor layer can be filled.

Consequently, the amount of oxygen vacancies in the oxide semiconductor layer can be reduced.

An oxide semiconductor used for the semiconductor layer 109 preferably contains at least indium (In) or zinc (Zn). Alternatively, the oxide semiconductor preferably contains both In and Zn. In order to reduce a variation in the electrical characteristics of the transistor including the oxide semiconductor, the oxide semiconductor preferably contains a stabilizer in addition to In and/or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given. The oxide semiconductor preferably contains one or more of the above-described stabilizers.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide including In, Ga, and Zn as main components and there is no limitation on the ratio of In, Ga, and Zn. The In—Ga—Zn oxide may contain a metal element other than the In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is an integer) may be used.

For example, an In—Ga—Zn oxide with an atomic ratio of In:Ga:Zn=1:1:1, In:Ga:Zn=2:2:1, or In:Ga:Zn=3:1:2, or any of oxides whose composition is in the neighborhood of the above compositions can be used. Alternatively, an In—Sn—Zn oxide with an atomic ratio of In:Sn:Zn=1:1:1, In:Sn:Zn=2:1:3, or In:Sn:Zn=2:1:5, or any of oxides whose composition is in the neighborhood of the above compositions may be used.

However, without limitation to the materials given above, a material with an appropriate composition may be used in accordance with needed semiconductor characteristics and electric characteristics (e.g., field-effect mobility, the threshold voltage, and variation). In order to obtain needed semiconductor characteristics, it is preferred that the carrier density, the impurity concentration, the defect density, the atomic ratio between metal elements and oxygen, the interatomic distance (bond distance), the density, and the like be set appropriately.

For example, high mobility can be obtained relatively easily in the case of using an In—Sn—Zn oxide. However, mobility can be increased by reducing the defect density in a bulk also in the case of using an In—Ga—Zn oxide.

Further, an oxide semiconductor having an energy gap larger than or equal to 2 eV, preferably larger than or equal to 2.5 eV, more preferably larger than or equal to 3 eV is used for an oxide semiconductor film used for the semiconductor layer 109. In this manner, the off-state current of a transistor can be reduced by using an oxide semiconductor having a wide energy gap.

A structure of an oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

Further, a CAAC-OS film including crystal parts can be preferably used as the semiconductor layer 109.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having a low impurity concentration. The impurity means an element other than main components of the oxide semiconductor film, such as hydrogen, carbon, silicon, or a transition metal element. In particular, an element (e.g., silicon) having higher strength of bonding to oxygen than a metal element included in the oxide semiconductor film takes oxygen away in the oxide semiconductor film to disrupt the atomic arrangement in the oxide semiconductor film, which causes a lowering of the crystallinity of the oxide semiconductor film. A heavy metal such as iron or nickel, argon, carbon dioxide, or the like has a large atomic radius (or molecular radius), and thus disrupts the atomic arrangement in the oxide semiconductor film when included in the oxide semiconductor film, which causes a lowering of the crystallinity of the oxide semiconductor film. Note that the impurity included in the oxide semiconductor film serves as a carrier trap or a carrier generation source in some cases.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus has a low carrier density. Thus, a transistor including the oxide semiconductor film rarely has a negative threshold voltage (is rarely normally-on). A highly purified intrinsic or substantially highly purified intrinsic oxide semiconductor film has few carrier traps. Thus, the transistor including the oxide semiconductor film has a small variation in electrical characteristics and accordingly has high reliability. Charges trapped by the carrier traps in the oxide semiconductor film take a long time to be released and may behave like fixed charges. Thus, the transistor including the oxide semiconductor film with a high impurity concentration and a high density of defect states has unstable electrical characteristics in some cases.

With the use of the CAAC-OS film in a transistor, a variation in the electrical characteristics of the transistor due to irradiation with visible light or ultraviolet light is small.

Next, a microcrystalline oxide semiconductor film which can be used as the semiconductor layer 109 will be described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a grain boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction image of the nc-OS film obtained by using an electron beam having a probe diameter (e.g., larger than or equal to 50 nm) larger than that of a crystal part. Meanwhile, spots are shown in a nanobeam electron diffraction image of the nc-OS film obtained by using an electron beam having a probe diameter (e.g., larger than or equal to 1 nm and smaller than or equal to 30 nm) close to, or smaller than or equal to that of a crystal part. Further, in a nanobeam electron diffraction image of the nc-OS film, regions with high luminance in a circular (ring) pattern are shown in some cases. Also in a nanobeam electron diffraction image of the nc-OS film, a plurality of spots are shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In an oxide semiconductor having a crystal part such as the CAAC-OS film, defects in the bulk can be further reduced and when the surface flatness of the oxide semiconductor is improved, mobility higher than that of an oxide semiconductor in an amorphous state can be obtained. In order to improve the surface planarity, the oxide semiconductor is preferably formed over a flat surface.

Note that since the transistor 150 described in this embodiment is a bottom-gate transistor, the substrate 101, the gate electrode layer 105, and the gate insulating layer 107 are located below the oxide semiconductor film. Accordingly, planarization treatment such as CMP (chemical mechanical polishing) treatment may be performed after the formation of the gate electrode layer 105 and the gate insulating layer 107 to obtain the above flat surface.

Further, the oxide semiconductor film may have a structure in which a plurality of oxide semiconductor films is stacked. For example, the oxide semiconductor film may have a stacked-layer structure of a first oxide semiconductor film and a second oxide semiconductor film which are formed using metal oxides with different compositions. For example, the first oxide semiconductor film may be formed using one of metal oxides, and the second oxide semiconductor film may be formed using a metal oxide different from the metal oxide used for the first oxide semiconductor film.

Further, the constituent elements of the first oxide semiconductor film and the second oxide semiconductor film may be the same but the compositions of the constituent elements of the first oxide semiconductor film and the second oxide semiconductor film may be different from each other. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3.

At this time, one of the first oxide semiconductor film and the second oxide semiconductor film which is closer to the gate electrode layer 105 (on a channel side) preferably contains In and Ga at a proportion of In >Ga. The other which is farther from the gate electrode layer 105 (on a back channel side) preferably contains In and Ga at a proportion of In≤Ga.

Further, the oxide semiconductor film may have a three-layer structure of the first oxide semiconductor film, the second oxide semiconductor film, and a third oxide semiconductor film, in which the constituent elements thereof are the same and the compositions of the first oxide semiconductor film, the second oxide semiconductor film, and the third oxide semiconductor film are different from each other. For example, the first oxide semiconductor film may have an atomic ratio of In:Ga:Zn=1:3:2, the second oxide semiconductor film may have an atomic ratio of In:Ga:Zn=3:1:2, and the third oxide semiconductor film may have an atomic ratio of In:Ga:Zn=1:1:1.

An oxide semiconductor film which contains less In than Ga and Zn at atomic ratio, typically, the first oxide semiconductor film having an atomic ratio of In:Ga:Zn=1:3:2, has a higher insulating property than an oxide semiconductor film which contains more In than Ga and Zn at atomic ratio, typically, the second oxide semiconductor film, and an oxide semiconductor film which contains Ga, Zn, and In at the same atomic ratio, typically, the third oxide semiconductor film.

Since the constituent elements of the first oxide semiconductor film, the second oxide semiconductor film, and the third oxide semiconductor film are the same, the first oxide semiconductor film has fewer trap levels at the interface with the second oxide semiconductor film. Therefore, when the oxide semiconductor film has the above structure, the amount of change in the threshold voltage of the transistor due to a change over time or a stress test can be reduced.

In an oxide semiconductor, the s orbital of heavy metal mainly contributes to carrier transfer, and when the In content in the oxide semiconductor is increased, overlap of the s orbitals is likely to be increased. Therefore, an oxide having a composition of In>Ga has higher mobility than an oxide having a composition of In Ga. Further, in Ga, the formation energy of an oxygen vacancy is larger and thus an oxygen vacancy is less likely to occur, than in In; therefore, the oxide having a composition of In≤Ga has more stable characteristics than the oxide having a composition of In>Ga.

An oxide semiconductor having a composition of In>Ga is used on a channel side, and an oxide semiconductor having a composition of In≤Ga is used on a back channel side; so that field-effect mobility and reliability of a transistor can be further improved.

Further, when the semiconductor layer 109 is formed to have a stacked structure, the first oxide semiconductor film, the second oxide semiconductor film, and the third oxide semiconductor film may be formed using oxide semiconductor films having different crystallinity. That is, the semiconductor layer 109 may be formed by combining a single crystal oxide semiconductor film, a polycrystalline oxide semiconductor film, an amorphous oxide semiconductor film, and a CAAC-OS film as appropriate. When an amorphous oxide semiconductor film is applied to any of the first oxide semiconductor film, the second oxide semiconductor film, and the third oxide semiconductor film, internal stress or external stress of the oxide semiconductor film is relieved, a variation in the characteristics of a transistor is reduced, and reliability of the transistor can be further improved.

The thickness of the oxide semiconductor film is preferably greater than or equal to 1 nm and less than or equal to 100 nm, more preferably greater than or equal to 1 nm and less than or equal to 50 nm, still more preferably greater than or equal to 1 nm and less than or equal to 30 nm, further preferably greater than or equal to 3 nm and less than or equal to 20 nm.

The concentration of an alkali metal or an alkaline earth metal in the oxide semiconductor film, which is obtained by secondary ion mass spectrometry (SIMS), is preferably lower than or equal to $1\times10^{18}$ atoms/cm$^3$, more preferably lower than or equal to $2\times10^{16}$ atoms/cm$^3$. This is because an alkali metal and an alkaline earth metal are bonded to an oxide semiconductor and generate carriers in some cases and cause an increase in off-state current of the transistor.

Further, the hydrogen concentration in the oxide semiconductor film, which is obtained by secondary ion mass spectrometry, is lower than $5\times10^{18}$ atoms/cm$^3$, preferably lower than or equal to $1\times10^{18}$ atoms/cm$^3$, more preferably lower than or equal to $5\times10^{17}$ atoms/cm$^3$, still more preferably lower than or equal to $1\times10^{16}$ atoms/cm$^3$.

Hydrogen contained in the oxide semiconductor film reacts with oxygen bonded to a metal atom to produce water, and a defect is formed in a lattice from which oxygen is released (or a portion from which oxygen is removed). In addition, a bond of part of hydrogen and oxygen causes generation of electrons serving as carrier. Thus, the impurities containing hydrogen are reduced as much as possible in the step of forming the oxide semiconductor film, whereby the hydrogen concentration in the oxide semiconductor film can be reduced. When a channel formation region is formed in an oxide semiconductor film which is highly purified by removing hydrogen as much as possible, a shift of the threshold voltage in the negative direction can be reduced, and the leakage current between a source and a drain of the transistor (typically, the off-state current or the like) can be decreased to several yA/µm to several zA/µm. As a result, electric characteristics of the transistor can be improved.

The oxide semiconductor film is formed by a sputtering method, a coating method, a pulsed laser deposition method, a laser ablation method, or the like.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film to be formed.

When a CAAC-OS film is formed, for example, the CAAC-OS film is formed by a sputtering method with a polycrystalline oxide semiconductor target. By collision of ions with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

After the oxide semiconductor film is formed, heat treatment may be performed so that the oxide semiconductor film is dehydrated or dehydrogenated. The temperature of the heat treatment is typically higher than or equal to 150° C. and lower than the strain point of the substrate, preferably higher than or equal to 250° C. and lower than or equal to 450° C., more preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

By performing heat treatment after the oxide semiconductor film is formed, in the oxide semiconductor film, the hydrogen concentration can be less than $5 \times 10^{18}$ atoms/cm$^3$, preferably less than or equal to $1 \times 10^{18}$ atoms/cm$^3$, more preferably less than or equal to $5 \times 10^{17}$ atoms/cm$^3$, still more preferably less than or equal to $1 \times 10^{16}$ atoms/cm$^3$.

Note that in the case where an oxide insulating layer is used as the gate insulating layer 107, when heat treatment is performed while the oxide semiconductor film is provided over the oxide insulating layer, oxygen can be supplied to the oxide semiconductor film, the oxygen defects in the oxide semiconductor film can be reduced, and semiconductor characteristics can be improved. The oxide semiconductor film and the oxide insulating layer may be subjected to a heating step in a state where the oxide semiconductor film and the oxide insulating layer are at least partly in contact with each other so that oxygen is supplied to the oxide semiconductor film.

The source electrode layer and the drain electrode layer which are provided over the semiconductor layer 109 can be formed using a material and a method similar to those of the gate electrode layer 105.

In this embodiment, the source electrode layer 111a and the drain electrode layer 111b are formed in such a manner that after a 50-nm-thick titanium film, a 400-nm-thick aluminum film, and a 100-nm-thick titanium film are stacked in this order using a sputtering apparatus, a resist mask is formed over the titanium film by a photolithography method, and part of the stacked film including the titanium film, the aluminum film, and the titanium film is selectively removed using the resist mask.

As a liquid crystal material used for the liquid crystal layer 125 over the capacitor 170, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions. Further, although not illustrated in FIGS. 1A and 1B, insulating films each of which serves as an alignment film and between which a layer containing any of these materials is interposed, a spacer which controls a distance (cell gap) between the transparent conductive layer 123 and the transparent conductive layer 127, or the like may be provided in the liquid crystal layer 125. Further, the alignment film can be formed using an organic material having heat resistance, such as an acrylic-based resin, a polyimide-based resin, a benzocyclobutene-based resin, a polyamide-based resin, or an epoxy-based resin.

Alternatively, a liquid crystal composition exhibiting a blue phase for which an alignment film is not used may be used for the liquid crystal layer 125. A blue phase is one of liquid crystal phases, which is generated just before a cholesteric phase changes into an isotropic phase while temperature of cholesteric liquid crystal is increased. The blue phase can be exhibited using a liquid crystal composition which is a mixture of a liquid crystal and a chiral material. In order to increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which contributes to the exclusion of the alignment process and reduction of viewing angle dependence. In addition, since an alignment film does not need to be provided and rubbing treatment is unnecessary, electrostatic discharge damage caused by the rubbing treatment can be prevented and defects and damage of a liquid crystal display device can be reduced in the manufacturing process. Thus, productivity of the liquid crystal display device can be increased. A transistor including an oxide semiconductor film has a possibility that the electric characteristics of the transistor may vary significantly by the influence of static electricity and deviate from the designed range. Therefore, it is more effective to use a liquid crystal composition exhibiting a blue phase for the liquid crystal display device including the transistor formed using an oxide semiconductor film.

The specific resistivity of the liquid crystal material is greater than or equal to $1 \times 10^9$ Ω·cm, preferably greater than or equal to $1 \times 10^{11}$ Ω·cm, more preferably greater than or equal to $1 \times 10^{12}$ Ω·cm. Note that the specific resistivity in this specification is measured at 20° C.

For a driving method of the liquid crystal layer 125, a TN (twisted nematic) mode, an IPS (in-plane-switching) mode, an FFS (fringe field switching) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the disclosed invention is not limited to the application to a display device for color display; the disclosed invention can also be applied to a display device for monochrome display.

Figure 5A:
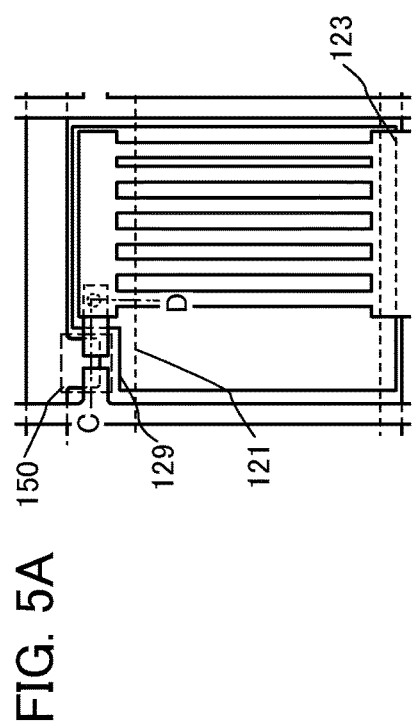
FIGS. 5A and 5B are a top view and a cross-sectional view, respectively, of a display device of one embodiment of the present invention.
Figure 5B:
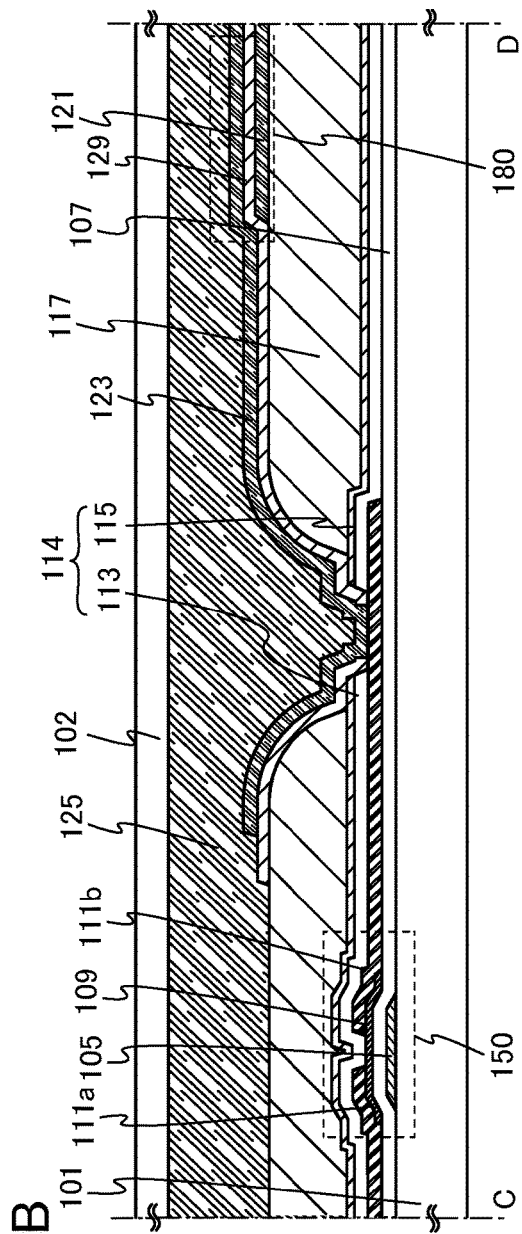

FIGS. 1A and 1B illustrate a structure in which the alignment of the liquid crystal layer 125 is controlled by the transparent conductive layer 123 and the transparent conductive layer 127. Accordingly, in FIGS. 1A and 1B, the transparent conductive layer 123 serves as a pixel electrode, and the transparent conductive layer 127 serves as a common electrode. FIGS. 5A and 5B illustrate a structure in which the alignment of the liquid crystal layer 125 is controlled in accordance with the electric field generated between the transparent conductive layer 121 and the transparent conductive layer 123 included in a capacitor 180. Accordingly, in FIGS. 5A and 5B, the transparent conductive layer 121 serves as a common electrode, and the transparent conductive layer 123 serves as a pixel electrode.

Note that the structure of the display device described in this embodiment is not limited to the structure illustrated in FIGS. 1A and 1B and may be the structure illustrated in FIGS. 5A and 5B.

FIGS. 5A and 5B illustrate part of a pixel included in a display device of another embodiment of the present invention. FIG. 5A is a top view illustrating part of the pixel included in the display device of another embodiment of the present invention, and FIG. 5B is a cross-sectional view taken along dashed-dotted line C-D in FIG. 5A. Note that in FIGS. 5A and 5B, the same parts as those in FIGS. 1A and 1B are denoted by the same reference numerals and not detailed.

The structure illustrated in FIGS. 5A and 5B is different from the structures illustrated in FIGS. 2A to 2C in that a second inorganic insulating film 129 part of which is used as a dielectric of the capacitor 180 overlaps with the drain electrode layer 111b of the transistor 150. With such a structure, the second inorganic insulating film 129 and the inorganic insulating film 115 are in contact with each other and can surround the organic insulating film 117, so that a gas released from the organic insulating film 117 can be prevented from diffusing into the transistor 150 side.

In the display device described in this embodiment, the exposed region is provided in the organic insulating film which is located on the side opposite to that of the transistor so that a gas released from the organic insulating film which is provided over the transistor does not enter the transistor side. The exposed portion is the region which does not overlap with the inorganic insulating film over the organic insulating film. Since the inorganic insulating film is formed so as not to be in contact with the exposed portion, a gas from the organic insulating film can be released from the exposed portion. Accordingly, a gas containing an impurity such as hydrogen, which is released from the organic insulating film, can be prevented from entering the oxide semiconductor layer, and characteristics of the transistor can be prevented from varying, so that a display device having high display quality and high reliability can be obtained.

This embodiment can be implemented in appropriate combination with the structures described in the other embodiments.

[Embodiment 2]

In this embodiment, an image sensor that can be used in combination with any of the display devices described in the above embodiment is described.

Figure 6A:
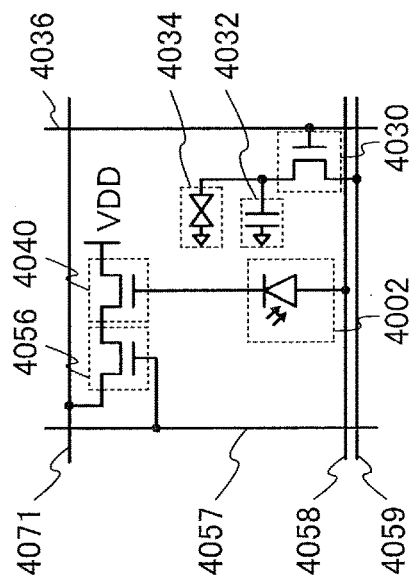
FIGS. 6A and 6B are a circuit diagram and a cross-sectional view, respectively, of an example of an image sensor of one embodiment of the present invention.

An example of a display device with an image sensor is illustrated in FIG. 6A. FIG. 6A illustrates an equivalent circuit of a pixel of the display device with an image sensor.

One electrode of a photodiode element 4002 is electrically connected to a reset signal line 4058, and the other electrode of the photodiode element 4002 is electrically connected to a gate electrode of a transistor 4040. One of a source electrode and a drain electrode of the transistor 4040 is electrically connected to a power supply potential (VDD), and the other of the source electrode and the drain electrode of the transistor 4040 is electrically connected to one of a source electrode and a drain electrode of a transistor 4056. A gate electrode of the transistor 4056 is electrically connected to a gate selection line 4057, and the other of the source electrode and the drain electrode of the transistor 4056 is electrically connected to an output signal line 4071.

A first transistor 4030 is a transistor for pixel switching. One of a source electrode and a drain electrode of the first transistor 4030 is electrically connected to a video signal line 4059, and the other of the source electrode and the drain electrode of the first transistor 4030 is electrically connected to a capacitor 4032 and a liquid crystal element 4034. A gate electrode of the first transistor 4030 is electrically connected to a gate line 4036.

Note that structures of the first transistor 4030 and the capacitor 4032 can be similar to those in the display device described in Embodiment 1.

Figure 6B:
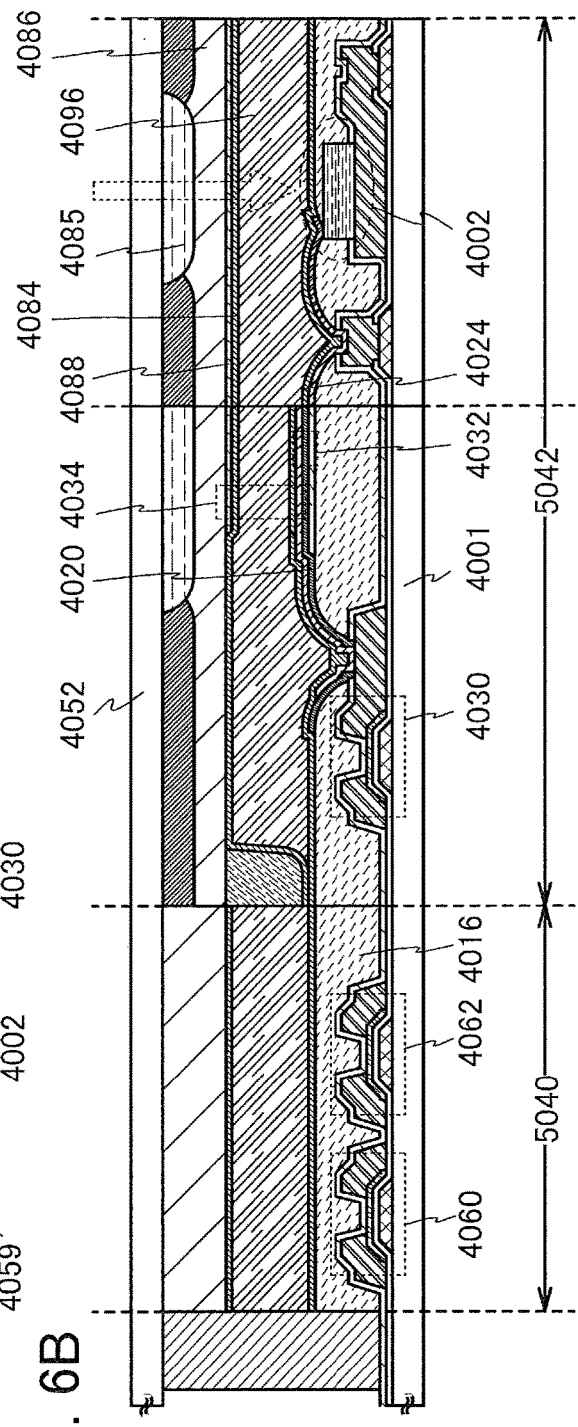

FIG. 6B illustrates a cross section of part of a pixel of the display device with an image sensor. In a pixel region, the photodiode element 4002 and the transistor 4030 are provided over a substrate 4001. Further, in the pixel portion 5042, an inorganic insulating film 4020 used as a dielectric of the capacitor 4032 is formed over an organic insulating film 4016. In part of a region of the inorganic insulating film 4020 which overlaps with the transistor 4030, an opening is formed. The organic insulating film 4016 has an exposed portion over which the inorganic insulating film is not formed.

With such a structure, a gas released from the organic insulating film 4016 can be prevented from entering the transistor 4030 side, so that a highly reliable display device can be obtained.

Note that the organic insulating film 4016 is provided over the photodiode element 4002 and the transistor 4030. The inorganic insulating film 4020 used as a dielectric of the capacitor 4032 is formed over the organic insulating film 4016 but is not provided over the part of the region which overlaps with the transistor 4030.

With such a structure, a released gas from the organic insulating film can be prevented from diffusing into the transistor, so that a highly reliable display device can be obtained.

In the photodiode element 4002, a lower electrode formed in the same step as the source electrode and the drain electrode of the transistor 4030 and an upper electrode formed in the same step as a pixel electrode of the liquid crystal element 4034 are included as a pair of electrodes, and a diode is present between the pair of electrodes.

As a diode that can be used as the photodiode element 4002, a pn-type diode including a stack of a p-type semiconductor film and an n-type semiconductor film, a pin-type diode including a stack of a p-type semiconductor film, an i-type semiconductor film, and an n-type semiconductor film, a Schottky diode, or the like can be used.

Over the photodiode element 4002, a first alignment film 4024, a liquid crystal layer 4096, a second alignment film 4084, a counter electrode 4088, an organic insulating film 4086, a colored film 4085, a counter substrate 4052, and the like are provided.

In this embodiment, the display device includes the first alignment film 4024 and the second alignment film 4084 between which the liquid crystal layer 4096 is interposed, unlike in Embodiment 1. For the first alignment film 4024 and the second alignment film 4084, a heat-resistant organic material such as an acrylic resin, a polyimide, a benzocyclobutene-based resin, a polyamide, or an epoxy resin can be used. The first alignment film 4024 is formed in contact with the organic insulating film 4016 and thus is preferably a film through which a gas from the organic insulating film 4016 is released.

Further, the alignment of the liquid crystal layer 4096 is controlled by voltage applied to the counter electrode 4088 and transparent conductive layers included in the capacitor 4032.

Note that a pin-type diode has better photoelectric conversion characteristics when the p-type semiconductor film side is used as a light-receiving plane. This is because the hole mobility is lower than the electron mobility. This embodiment shows an example in which light which enters the photodiode element 4002 from a surface of the counter substrate 4052 through the liquid crystal layer 4096 and the like is converted into an electric signal, but this example does not limit the present invention. Alternatively, the colored film and the like may be provided on the counter substrate side.

The photodiode element 4002 described in this embodiment utilizes flow of current between the pair of electrodes which is caused by entry of light into the photodiode element 4002. When the photodiode element 4002 detects light, information of an object to be detected can be read.

By performing, for example, a step of forming the transistor for the display device and a step for the image sensor at the same time, the productivity of the display device with the image sensor described in this embodiment can be increased. However, any of the display devices described in the above embodiment and the image sensor described in this embodiment may be fabricated over different substrates. Specifically, the image sensor may be fabricated over the second substrate in any of the display devices described in the above embodiment.

This embodiment can be implemented in appropriate combination with any of the structures described in the other embodiments.

[Embodiment 3]

In this embodiment, an example of a tablet terminal using a display device of one embodiment of the present invention is described.

Figure 7A:
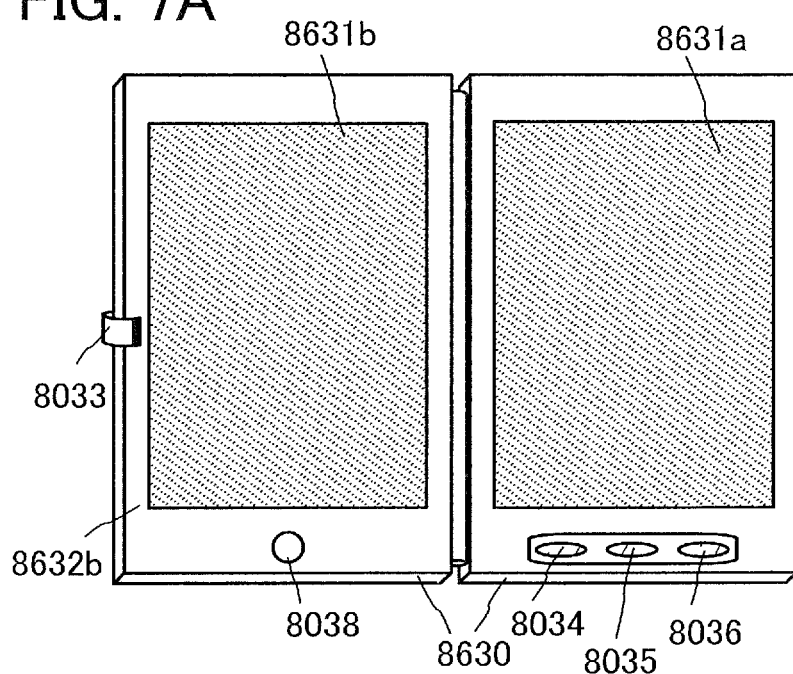
FIGS. 7A to 7C are diagrams illustrating an example of a tablet terminal of one embodiment of the present invention.
Figure 7B:
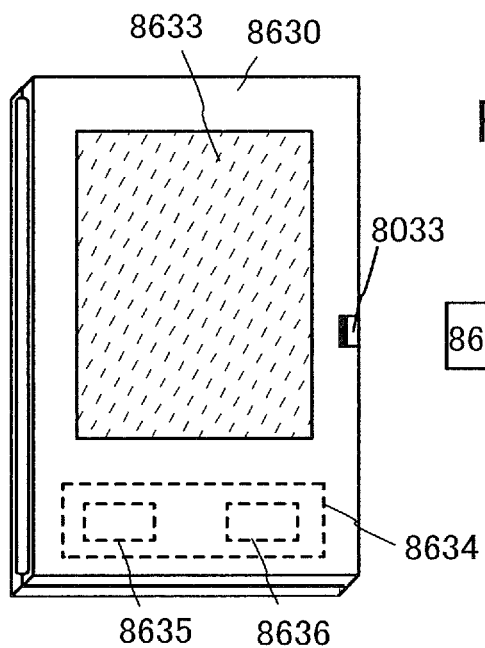

FIGS. 7A and 7B illustrate a foldable tablet terminal. FIG. 7A illustrates the tablet terminal which is unfolded. The tablet terminal includes a housing 8630, and a display portion 8631*a*, a display portion 8631*b*, a display mode switch 8034, a power switch 8035, a power-saving mode switch 8036, a clasp 8033, and an operation switch 8038 which are provided on the housing 8630.

The whole or part of the display portion 8631*a* can function as a touch panel and data can be input when a displayed operation key is touched. For example, the display portion 8631*a* can display keyboard buttons in the whole region to function as a touch panel, and the display portion 8631*b* may be used as a display screen.

Like the display portion 8631*a*, the whole or part of the display portion 8631*b* can function as a touch panel.

Further, a touch panel region of the display portion 8631*a* and a touch panel region of the display portion 8631*b* can be touched for input at the same time.

With the display mode switch 8034, the display can be switched between a portrait mode, a landscape mode, and the like, and between monochrome display and color display, for example. With the power-saving mode switch 8036, display luminance can be controlled in accordance with external light detected by an optical sensor incorporated in the tablet terminal. Note that in addition to the optical sensor, another detection device including a sensor such as a gyroscope or an acceleration sensor which is capable of detecting inclination may be included in the tablet terminal.

Note that FIG. 7A shows an example in which the areas of the display portion 8631*a* and the display portion 8631*b* are the same; however, this example does not limit the present invention. The display portion 8631*a* and the display portion 8631*b* may differ in area or display quality. For example, one display panel may be capable of higher-definition display than the other display panel.

The tablet terminal is closed in FIG. 7B. The tablet terminal includes the housing 8630, and a solar cell 8633 and a charge and discharge control circuit 8634 with which the housing 8630 is provided. In FIG. 7B, a structure including a battery 8635 and a DCDC converter 8636 is illustrated as an example of the charge and discharge control circuit 8634.

Since the tablet terminal is foldable, the housing 8630 can be closed when the tablet terminal is not used. Thus, the display portion 8631*a* and the display portion 8631*b* can be protected, which leads to excellent durability and excellent reliability in terms of long-term use.

The tablet terminal illustrated in FIGS. 7A and 7B can also have a function of displaying various kinds of data (e.g., a still image, a moving image, and a text image), a function of displaying a calendar, the date, the time, or the like on the display portion, a touch-input function of operating or editing data displayed on the display portion by touch input, a function of controlling processing by various kinds of software (programs), and the like.

Electric power obtained with the solar cell 8633 can be used for the operation of the tablet terminal or can be stored in the battery 8635. Note that the solar cell 8633 can be provided on both surfaces of the housing 8630. When a lithium ion battery is used as the battery 8635, there is an advantage of downsizing or the like.

Figure 7C:
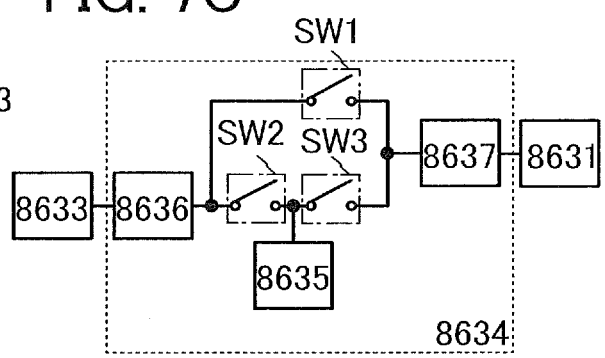

The structure and the operation of the charge and discharge control circuit 8634 illustrated in FIG. 7B are described with reference to a block diagram in FIG. 7C. In FIG. 7C, the solar cell 8633, the battery 8635, the DCDC converter 8636, a converter 8637, a switch SW1, a switch SW2, a switch SW3, and a display portion 8631 are illustrated. The battery 8635, the DCDC converter 8636, the converter 8637, and the switches SW1 to SW3 in FIG. 7C correspond to the charge and discharge control circuit 8634 illustrated in FIG. 7B.

In the case where power is generated by the solar cell 8633, the voltage of the power generated by the solar cell is raised or lowered by the DCDC converter 8636 so that the power has a voltage for charging the battery 8635. Then, the switch SW1 is turned on and the voltage of the power is stepped up or down by the converter 8637 so as to be the most suitable voltage for the display portion 8631. In addition, when display on the display portion 8631 is not performed, the switch SW1 is turned off and the switch SW2 is turned on so that the battery 8635 is charged.

Note that the solar cell 8633 is described as an example of a power generation means, but this does not limit the present invention. Another power generation means such as a piezoelectric element or a thermoelectric conversion element (Peltier element) may be used instead. For example, the battery may be charged with another charging means, such as a non-contact power transmission module which is capable of charging by transmitting and receiving power wirelessly (without contact), used in combination.

When the display device described in the above embodiment is applied to each of the display portion 8631*a* and the display portion 8631*b* which are included in the tablet terminal described in this embodiment, higher reliability can be obtained.

This embodiment can be implemented in appropriate combination with any of the structures described in the other embodiments.

[Embodiment 4]

In this embodiment, examples of an electronic device including any of the display devices described in the above embodiments or the like are described.

Figure 8A:
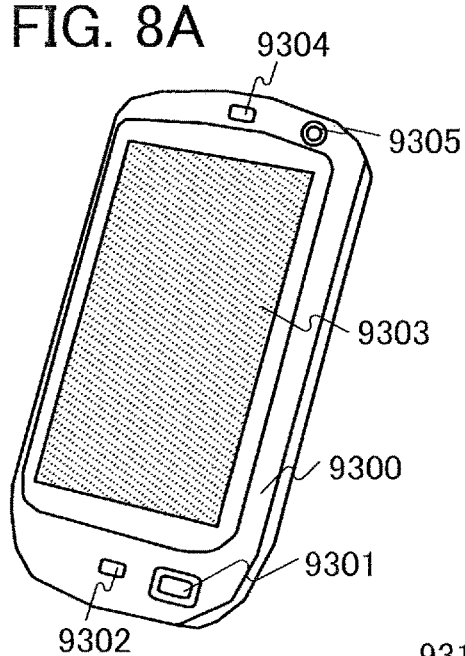
FIGS. 8A to 8C are diagrams each illustrating an example of an electronic device of one embodiment of the present invention.

FIG. 8A illustrates a portable information terminal. The portable information terminal illustrated in FIG. 8A includes a housing 9300, a button 9301, a microphone 9302, a display portion 9303, a speaker 9304, and a camera 9305, and has a function as a mobile phone. Any of the display devices and the display device with an image sensor described in the above embodiments can be applied to the display portion 9303.

Figure 8B:
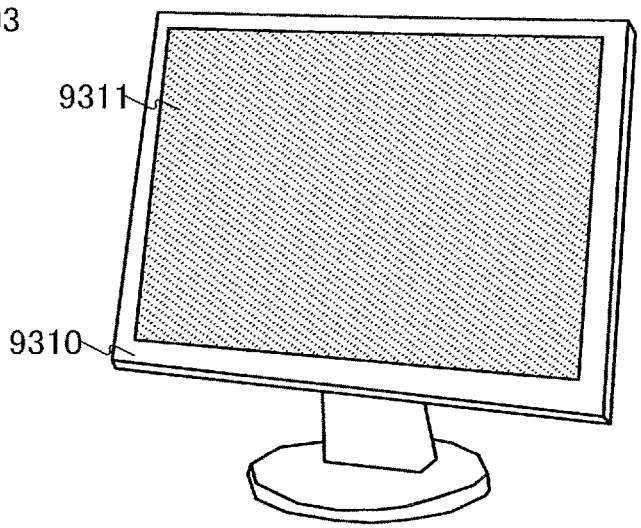

FIG. 8B illustrates a display. The display illustrated in FIG. 8B includes a housing 9310 and a display portion 9311. Any of the display devices and the display device with an image sensor which are described in the above embodiments can be applied to the display portion 9311.

Figure 8C:
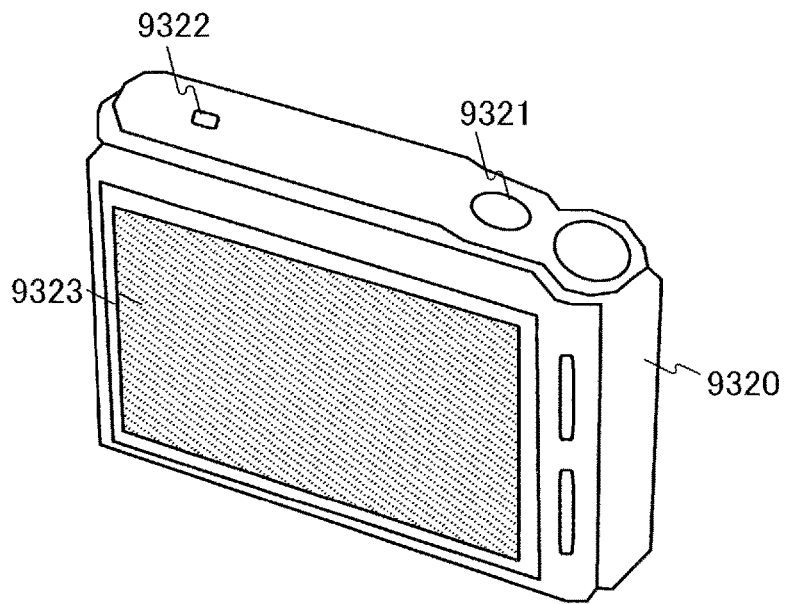

FIG. 8C illustrates a digital still camera. The digital still camera illustrated in FIG. 8C includes a housing 9320, a button 9321, a microphone 9322, and a display portion 9323. Any of the display devices and the display device with an image sensor described in the above embodiments can be applied to the display portion 9323.

By application of one embodiment of the present invention, the reliability of the electronic devices can be increased.

This embodiment can be implemented in appropriate combination with any of the structures described in the other embodiments.

REFERENCE NUMERALS

101: substrate, 102: substrate, 105: gate electrode layer, 107: gate insulating layer, 109: semiconductor layer, 111*a*: source electrode layer, 111*b*: drain electrode layer, 114: first inorganic insulating film, 113: inorganic insulating film, 115: inorganic insulating film, 117: organic insulating film, 119: second inorganic insulating film, 121: transparent conductive layer, 123: transparent conductive layer, 125: liquid crystal layer, 127: transparent conductive layer, 129: second inorganic insulating film, 150: transistor, 170: capacitor, 180: capacitor, 1000: pixel portion, 1001: sealant, 1003: signal line driver circuit, 1004: scan line driver circuit, 1018: FPC, 4001: substrate, 4002: photodiode element, 4016: organic insulating film, 4020: inorganic insulating film, 4024: alignment film, 4030: transistor, 4032: capacitor, 4034: liquid crystal element, 4036: gate line, 4040: transistor, 4052: counter substrate, 4056: transistor, 4057: gate selection line, 4058: reset signal line, 4059: video signal line, 4071: output signal line, 4084: alignment film, 4086: organic insulating film, 4088: counter electrode, 4096: liquid crystal layer, 5042: pixel portion, 8033: clasp, 8034: switch, 8035: power switch, 8036: switch, 8038: operation switch, 8630: housing, 8631: display portion, 8631*a*: display portion, 8631*b*: display portion, 8633: solar cell, 8634: charge and discharge control circuit, 8635: battery, 8636: DCDC converter, 8637: converter, 9300: housing, 9301: button, 9302: microphone, 9303: display portion, 9304: speaker, 9305: camera, 9310: housing, 9311: display portion, 9320: housing, 9321: button, 9322: microphone, and 9323: display portion.

This application is based on Japanese Patent Application serial no. 2012-161726 filed with Japan Patent Office on Jul. 20, 2012, the entire contents of which are hereby incorporated by reference.

The invention claimed is:

1. A display device comprising:
    a pixel portion comprising:
        a transistor comprising an oxide semiconductor layer;
        a first inorganic insulating film over the transistor;
        an organic insulating film over the first inorganic insulating film;
        a first transparent conductive layer over the organic insulating film;
        a second inorganic insulating film over the first transparent conductive layer; and
        a second transparent conductive layer over the second inorganic insulating film,
    wherein the second transparent conductive layer is electrically connected to one of a source electrode layer and a drain electrode layer of the transistor in a first opening of the first inorganic insulating film and in a second opening of the organic insulating film,
    wherein the oxide semiconductor layer comprises indium, gallium, and zinc,
    wherein an edge portion of the second inorganic insulating film overlaps with the organic insulating film in the pixel portion,
    wherein the second transparent conductive layer is in contact with a top surface of a first region of the first inorganic insulating film in the second opening, and
    wherein the organic insulating film comprises a second region that does not overlap with the second inorganic insulating film and the second transparent conductive layer.

2. The display device according to claim 1, wherein the second inorganic insulating film and the oxide semiconductor layer do not overlap with each other.

3. The display device according to claim 1, wherein edge portions of the oxide semiconductor layer are in contact with the source and drain electrode layers.

4. The display device according to claim 1, wherein the first inorganic insulating film has a stacked-layer structure.

5. The display device according to claim 1, wherein the second inorganic insulating film comprises silicon and nitrogen.

6. The display device according to claim 1, wherein the organic insulating film comprises an organic resin.

7. A display device comprising:
a pixel portion comprising:
a gate electrode;
an oxide semiconductor layer overlapping with the gate electrode with a gate insulating layer interposed therebetween;
a source electrode electrically connected to the oxide semiconductor layer;
a drain electrode electrically connected to the oxide semiconductor layer;
a first inorganic insulating film over the source electrode and the drain electrode;
an organic insulating film over the first inorganic insulating film;
a first transparent conductive layer over the organic insulating film;
a second inorganic insulating film over the first transparent conductive layer;
a second transparent conductive layer over the second inorganic insulating film; and
a liquid crystal layer over the second transparent conductive layer,
wherein the second transparent conductive layer is electrically connected to one of the source electrode and the drain electrode in a first opening of the first inorganic insulating film and in a second opening of the organic insulating film,
wherein the oxide semiconductor layer comprises indium, gallium, and zinc,
wherein an edge portion of the second inorganic insulating film overlaps with the organic insulating film in the pixel portion,
wherein the second transparent conductive layer is in contact with a top surface of a first region of the first inorganic insulating film in the second opening, and
wherein the organic insulating film comprises a second region that does not overlap with the second inorganic insulating film and the second transparent conductive layer.

8. The display device according to claim 7, wherein the gate electrode is located under the oxide semiconductor layer.

9. The display device according to claim 7, wherein the second inorganic insulating film and the oxide semiconductor layer do not overlap with each other.

10. The display device according to claim 7, wherein edge portions of the oxide semiconductor layer are in contact with the source and drain electrode layers.

11. The display device according to claim 7, wherein the first inorganic insulating film has a stacked-layer structure.

12. The display device according to claim 7, wherein the second inorganic insulating film comprises silicon and nitrogen.

13. The display device according to claim 7, wherein the organic insulating film comprises an organic resin.

14. A display device comprising:
a pixel portion comprising:
a gate electrode;
an oxide semiconductor layer overlapping with the gate electrode with a gate insulating layer interposed therebetween;
a source electrode electrically connected to the oxide semiconductor layer;
a drain electrode electrically connected to the oxide semiconductor layer;
a first inorganic insulating film over the source electrode and the drain electrode;
an organic insulating film over the first inorganic insulating film;
a first transparent conductive layer over the organic insulating film;
a second inorganic insulating film over the first transparent conductive layer;
a second transparent conductive layer over the second inorganic insulating film; and
a liquid crystal layer over the second transparent conductive layer,
wherein the second transparent conductive layer is electrically connected to one of the source electrode and the drain electrode in a first opening of the first inorganic insulating film and in a second opening of the organic insulating film,
wherein the oxide semiconductor layer comprises indium, gallium, and zinc,
wherein an edge portion of the second inorganic insulating film overlaps with the organic insulating film in the pixel portion,
wherein the second transparent conductive layer is in contact with a top surface of a first region of the first inorganic insulating film in the second opening,
wherein the organic insulating film comprises a second region that does not overlap with the second inorganic insulating film and the second transparent conductive layer, and
wherein the second transparent conductive layer overlaps with the first transparent conductive layer with the second inorganic insulating film interposed therebetween.

15. The display device according to claim 14, wherein the gate electrode is located under the oxide semiconductor layer.

16. The display device according to claim 14, wherein the second inorganic insulating film and the oxide semiconductor layer do not overlap with each other.

17. The display device according to claim 14, wherein edge portions of the oxide semiconductor layer are in contact with the source and drain electrode layers.

18. The display device according to claim 14, wherein the first inorganic insulating film has a stacked-layer structure.

19. The display device according to claim 14, wherein the second inorganic insulating film comprises silicon and nitrogen.

20. The display device according to claim 14, wherein the organic insulating film comprises an organic resin.

* * * * *